(12) United States Patent
Wurm et al.

(10) Patent No.: US 7,250,620 B2
(45) Date of Patent: Jul. 31, 2007

(54) EUV LITHOGRAPHY FILTER

(75) Inventors: Stefan Wurm, Austin, TX (US); Vivek Bakshi, Austin, TX (US)

(73) Assignees: Infineon Technologies AG, Munich (DE); Sematech Inc., Austin, TX (US)

( * ) Notice: Subject to any disclaimer, the term of this patent is extended or adjusted under 35 U.S.C. 154(b) by 374 days.

(21) Appl. No.: 11/039,170

(22) Filed: Jan. 20, 2005

(65) Prior Publication Data

US 2006/0160031 A1 Jul. 20, 2006

(51) Int. Cl.
G03C 5/00 (2006.01)
G03B 27/42 (2006.01)
G03B 27/54 (2006.01)

(52) U.S. Cl. .............................. 250/504 R; 250/492.2; 250/372; 250/503.1; 378/156; 378/158

(58) Field of Classification Search ............. 250/504 R
See application file for complete search history.

(56) References Cited

U.S. PATENT DOCUMENTS

| | | | |
|---|---|---|---|
| 6,377,651 B1 | 4/2002 | Richardson et al. | |
| 6,614,505 B2 | 9/2003 | Koster et al. | |
| 6,678,037 B2 * | 1/2004 | Van Elp et al. | 355/67 |
| 6,838,684 B2 | 1/2005 | Bakker et al. | |
| 6,878,871 B2 * | 4/2005 | Scher et al. | 136/252 |
| 6,930,760 B2 * | 8/2005 | Van Elp et al. | 355/67 |
| 7,020,372 B2 * | 3/2006 | Lee et al. | 385/129 |
| 7,029,808 B2 * | 4/2006 | Rau et al. | 430/30 |
| 7,109,503 B1 * | 9/2006 | Bowering et al. | 250/503.1 |
| 7,189,446 B2 * | 3/2007 | Olszewski et al. | 428/116 |
| 7,196,342 B2 * | 3/2007 | Ershov et al. | 250/504 R |
| 2003/0089237 A1 * | 5/2003 | Jagtoyen et al. | 96/108 |
| 2003/0147499 A1 * | 8/2003 | Kondo | 378/119 |
| 2004/0115563 A1 * | 6/2004 | Rau et al. | 430/311 |
| 2004/0118285 A1 * | 6/2004 | Kim et al. | 96/55 |
| 2005/0107870 A1 * | 5/2005 | Wang et al. | 623/1.44 |
| 2006/0147839 A1 * | 7/2006 | Rau et al. | 430/270.1 |
| 2006/0160031 A1 * | 7/2006 | Wurm et al. | 430/322 |
| 2006/0192151 A1 * | 8/2006 | Bowering et al. | 250/503.1 |

OTHER PUBLICATIONS

"Filter Transmission," http://www.cxro.lbl.gov/optical_constants/filter2.html, 1 page, downloaded Jan. 17, 2005.
"SEMATECH: Lithography: EUV Source Workshop," Sep. 29, 2003, pp. 1-2, http://www.sematech.org/resources/litho/meetings/euvl/20030929/index.htm, downloaded Jan. 17, 2005.
"The Nanotube Site," http://www.pa.msu.edu/cmp/csc/NTSite/menu.html, 1 page, downloaded Dec. 29, 2004.

(Continued)

Primary Examiner—Robert Kim
Assistant Examiner—Bernard Souw
(74) Attorney, Agent, or Firm—Slater & Matsil, L.L.P.

(57) ABSTRACT

Filters for EUV lithography, methods of manufacture thereof, and methods of filtering in an EUV lithography system are disclosed. The filter comprises a nanotube material layer sandwiched by two thin material layers that are highly transmissive and provide structural support for the nanotube material layer. The filter is supported on at least one side by a patterned structural support. The filter mitigates debris, provides spectral purity filtering, or both.

38 Claims, 5 Drawing Sheets

OTHER PUBLICATIONS

"The Nanotube Site," http://www.pa.msu.edu/cmp/csc/NTSite/nanopage.html, pp. 1-8, downloaded Dec. 29, 2004.

Flora, F., et al., "Krypton as Filter for Ions, Debris and Useless Radiation in EUV Projection Lithography Systems," Proceedings of SPIE, 2001, pp. 77-86, vol. 4504, SPIE, Bellingham, WA.

Fomenkov, I.V., et al., "Optimization of a Dense Plasma Focus Device as a Light Source for EUV Lithography," Proceedings of SPIE, 2002, pp. 634-647, vol. 4688, SPIE, Bellingham, WA.

López, E.V., et al., "Origins of Debris and Mitigation Through a Secondary RF Plasma System for Discharge-Produced EUV Sources," Proceedings of SPIE, 2004, pp. 183-192, vol. 5374, SPIE, Bellingham, WA.

Powell, F.R., et al., "Filter Windows for EUV Lithography," Proceedings of SPIE, 2001, pp. 585-589, vol. 4343, SPIE, Bellingham, WA.

Shmaenok, L.A., et al., "Demonstration of a Foil Trap Technique to Eliminate Laser Plasma Atomic Debris and Small Particulates," Proceedings of SPIE, 1998, pp. 90-94, vol. 3331, SPIE, Bellingham, WA.

Stamm, U., et al., "EUV Source Power and Lifetime: The Most Critical Issues for EUV Lithography," Proceedings of SPIE, 2004, pp. 133-144, vol. 5374, SPIE, Bellingham, WA.

Takenoshita, K., et al., "Debris Studies for the Tin-Based Droplet Laser-Plasma EUV Source," Proceedings of SPIE, 2004, pp. 954-963, vol. 5374, SPIE, Bellingham, WA.

Takenoshita, K., et al., "The Repeller Field Debris Mitigation Approach for EUV Sources," Proceedings of SPIE, 2003, pp. 792-799, vol. 5037, SPIE, Bellingham, WA.

Ueno, Y., et al., "Debris-Free EUV Source Using a Through-Hole Tin Target," Proceedings of SPIE, 2003, pp. 750-758, vol. 5037, SPIE, Bellingham, WA.

Wolf, S., et al., "Silicon Processing for the VLSI Era: vol. 1—Process Technology," 2nd Ed., 2000, pp. 546-548, Lattice Press, Sunset Beach, CA.

Wolf, S., et al., "Silicon Processing for the VLSI Era: vol. 1—Process Technology," 2nd Ed., 2000, pp. 638-650, Lattice Press, Sunset Beach, CA.

Yamamoto, M., et al., "Compact Debris Shutter Design of a Laser-Produced Plasma Source for High NA Application," Proceedings of SPIE, 2000, pp. 128-131, vol. 4146, SPIE, Bellingham, WA.

"Debris Measurements," downloaded Feb. 27, 2005, p. 34, Cymer, Inc., http://www.sematech.org/resources/litho/meetings/euvl/20040222b/presentations/03Fomenkov.pdf.

"Foil Comb Differential Pressure EUV Window," downloaded Feb. 27, 2005, p. 4, Plex LLC, http://www.sematech.org/resources/litho/meetings/euvl/20030223a/12-Star%20Pinch%20Scalable%20EUV%20Sourch-McGeoch.pdf.

"GDPP EUV Source: Collector Optics Lifetime," downloaded Feb. 27, 2005, p. 16, Xtreme Technologies, http://www.sematech.org/resources/litho/meetings/euvl/20040222b/presentations/10Gabel.pdf.

* cited by examiner

EUV LITHOGRAPHY FILTER

TECHNICAL FIELD

The present invention relates generally to the manufacturing of semiconductor devices, and more particularly to filters for use with extreme ultraviolet lithography (EUVL) systems.

BACKGROUND

Semiconductor devices are manufactured by depositing many different types of material layers over a semiconductor workpiece or wafer, and patterning the various material layers using lithography. The material layers typically comprise thin films of conductive, semiconductive, and insulating materials that are patterned and etched to form integrated circuits (IC's).

For many years in the semiconductor industry, optical lithography techniques such as contact printing, proximity printing, and projection printing have been used to pattern material layers of integrated circuits. Projection printing is commonly used in the semiconductor industry using wavelengths of 248 nm or 193 nm, as examples. At such wavelengths, lens projection systems and transmission lithography masks are used for patterning, wherein light is passed through the lithography mask to impinge upon a wafer.

However, as the minimum feature sizes of IC's are decreased, the semiconductor industry is trending towards the use of very short wavelength, immersion lithography technologies or non-optical lithographic techniques to achieve the decreased feature sizes demanded by the industry.

For lithographic printing of integrated circuit patterns below about 50 nm feature sizes, EUVL technology using light in the soft x-ray range (e.g., about 10 to 15 nm) is under development. Ultraviolet (UV) light has a shorter wavelength than visible light. For example, UV light is usually considered to fall within the wavelength range of about 157 to 400 nm. In EUVL, extreme UV (EUV) light, having a shorter wavelength than UV light, e.g., about 13.5 nm, is used as the wavelength. In EUVL, plasma is used to generate a broadband radiation with significant EUV radiation. The EUV radiation is collected by a system of mirrors coated with EUV reflecting interference films, also known as Bragg reflectors. The EUV radiation is then used to illuminate an EUV reflection lithography mask. The pattern on the lithography mask is imaged and de-magnified onto a resist-coated wafer. The entire lithography mask pattern is exposed onto the wafer by synchronously scanning the lithography mask and the wafer.

EUV radiation or EUV light used in EUV lithography (EUVL) systems may be generated by heating fuel materials such as xenon, lithium, or tin via discharge produce plasmas (DPP) or via laser produced plasmas (LPP). In DPP EUV sources, fuel is heated via magnetic compression, while in LPP, fuel is bombarded with a focused laser beam to produce the heating. However, in the process of generating EUV radiation, in these methods, additional unwanted radiation and debris are produced. The debris includes particle debris, e.g., micron sized particles, and high energetic atomic species. This debris can include particles (neutral or charged), ions, neutral atoms, molecules (neutral and ions), and electrons, as examples.

In an EUV lithography system, in order to extract the EUV light, an optic mirror is used. The optic mirror is costly, has a certain useful lifetime, and cannot be replaced frequently, and thus needs to be protected from the debris. The optic mirror needs to be protected such that as much of the EUV light passes through as possible, while the debris is prevented from reaching the optic mirror. The kinetic energy of the debris can be very high and may cause erosion of the EUV system collecting optics, such as a grazing incidence collector, multilayer mirrors, or near normal incident Bragg reflector mirrors used in the sources as EUV light collectors. The erosion of the EUV system collecting optics is caused by kinetic energy sputtering of the debris produced by the generation of the EUV radiation, while there may be other contributing factors to this erosion, such as potential sputtering and chemical erosion, as examples.

In addition, some of the debris comprises highly charged ions that are generated by the EUV producing plasma. The highly charged ion debris can be very damaging to EUV system collecting optics surfaces, even at very low kinetic energies. This erosion is caused by potential energy sputtering of the highly charged ion debris. The damage caused by this kind of debris to the EUV collecting optics in EUV sources significantly reduces the lifetime of the EUV lenses and mirrors, and increases cost of ownership (COO) for EUV sources and EUV lithography systems.

Mitigating debris to prevent the debris from reaching the collecting optics is considered one of the largest challenges in the development of EUV lithography. Extending the lifetime of the plasma-facing collector mirror, which delivers the EUV light into focus, is one of the most critical issues for EUV lithography development, for example. "Foil trap" based debris mitigation devices are generally used today by the industry to mitigate the debris, i.e., to prevent it from reaching EUV mirror surfaces, as described by Shmaenok, L. A., et al., in "Demonstration of a Foil Trap Technique to Eliminate Laser Plasma Atomic Debris and Small Particulates," Proceedings of SPIE, 1998, pp. 90-94, Vol. 3331, which is incorporated herein by reference, and also in U.S. Pat. No. 6,838,684, issued on Jan. 4, 2005 to Bakker et al., which is also incorporated herein by reference. The foil trap devices trap debris on a system of foils near the EUV light source, or divert particles by bouncing them off surfaces. However, there are limitations of using foil trap based debris mitigation devices. The transmission loss of such devices is typically about 40 to 60% of the EUV light generated by the plasma. Furthermore, a significantly large amount of the debris passes through the foil trap debris mitigation devices, causing erosion and damage, and debris build-up on the collecting optics for EUV light.

Other debris mitigation devices and methods include repeller fields, in which an electric field is used to repel ions or charged particles, as described by Takenoshita, K., et al., in "The Repeller Field Debris Mitigation Approach for EUV Sources," Proceedings of SPIE, 2003, pp. 792-799, Vol. 5037, which is incorporated herein by reference, and also in U.S. Pat. No. 6,377,651 issued on Apr. 23, 2002 to Richardson et al. on Apr. 23, 2002, and U.S. Pat. No. 6,614,505 issued on Sep. 2, 2003 to Koster et al., which are incorporated herein by reference. Uncharged particles are, however, allowed to pass through repeller fields. Other debris mitigation attempts include using metal meshes coated with a material; background gases like Krypton, Argon, or Helium; Cu or Ta tape; and RF plasma in combination with a foil trap, as examples. While these methods and devices increase optics protection, these methods do not completely eliminate the debris emanating from EUV light sources that causes damage to and built-up on the collecting optics and other components of the EUV lithography system. Also, these prior art methods and devices significantly reduce the EUV light transmission, thereby increasing the time it takes to expose a wafer and thus significantly increasing cost of ownership for EUV lithography systems.

Furthermore, the lifetime of existing EUV light collection optics in the EUV lithography systems is about 500 million pulses, due to the large amount of debris that causes damage to the optical components. A lifetime of about 50 to 100 billion pulses is needed in the art, for EUV lithography to be a viable and cost-effective lithography method in high volume production.

Thus, what are needed in the art are improved devices and methods of filtering debris that do not excessively lower the EUV light transmission in EUV lithography systems.

SUMMARY OF THE INVENTION

These and other problems are generally solved or circumvented, and technical advantages are generally achieved, by preferred embodiments of the present invention, which provide novel filters that include highly EUV transparent nanotube films and supportive materials. The filters are adapted to reduce debris generated by EUV light sources and are also adapted to filter out non-EUV wavelengths of light.

In accordance with a preferred embodiment of the present invention, a filter includes a first material layer, the first material layer comprising a nanotube material and having a first side and a second side, the first material layer being transparent to a first wavelength of light, and a second material layer disposed over the first side of the first material layer, the second material layer being also transparent to the first wavelength of light. A third material layer is disposed over the second material layer, the third material layer comprising a supportive material and being patterned to expose a portion of the second material layer. A fourth material layer is disposed over the second side of the first material layer, the fourth material layer being transparent to the first wavelength of light.

In accordance with another preferred embodiment of the present invention, a method of manufacturing a filter includes providing a first material layer, the first material layer comprising a nanotube material and having a first side and a second side, the first material layer being transparent to a first wavelength of light, and disposing a second material layer over the first side of the first material layer, the second material layer being transparent to the first wavelength of light. A third material layer is disposed over the second material layer, the third material layer comprising a supportive material, and a fourth material layer is disposed over the second side of the first material layer, the fourth material layer being transparent to the first wavelength of light. The third material layer is patterned to expose a portion of the second material layer.

In accordance with another preferred embodiment of the present invention, a method of filtering debris in an EUV lithography system having at least one optical component includes disposing a filter proximate the at least one optical component, the filter comprising a layer of nanotube material with support material disposed on at least one side of the nanotube material, and generating EUV radiation, wherein generating the EUV radiation produces debris. The filter is adapted to reduce accumulation of the debris on the optical component and reduce damage to the optical component.

Advantages of embodiments of the present invention include enabling the viability of EUV lithography in high volume production environments by increasing the lifetime of EUV lithography equipment. The reduction in debris provided by the filters described herein reduces the cost of ownership of the systems and extends the lifetime of EUV lithography equipment significantly. The filters have a high EUV transmission, e.g., 70% or greater, with improved filtering performance and increased optics protection. The filters may also be adapted to provide spectral purity filtering, and thus can be used anywhere along the path of EUV light in an EUV lithography system. The use of a separate spectral purity filter can be eliminated with the use of the filters, reducing the number of components in an EUV lithography system. The ease of manufacture and low cost of components make the filters a cost-effective, consumable yet inexpensively replaceable, solution to the damaging debris problems of EUV lithography systems.

The foregoing has outlined rather broadly the features and technical advantages of embodiments of the present invention in order that the detailed description of the invention that follows may be better understood. Additional features and advantages of embodiments of the invention will be described hereinafter, which form the subject of the claims of the invention. It should be appreciated by those skilled in the art that the conception and specific embodiments disclosed may be readily utilized as a basis for modifying or designing other structures or processes for carrying out the same purposes of the present invention. It should also be realized by those skilled in the art that such equivalent constructions do not depart from the spirit and scope of the invention as set forth in the appended claims.

BRIEF DESCRIPTION OF THE DRAWINGS

For a more complete understanding of the present invention, and the advantages thereof, reference is now made to the following descriptions taken in conjunction with the accompanying drawings, in which.

Corresponding numerals and symbols in the different figures generally refer to corresponding parts unless otherwise indicated. The figures are drawn to clearly illustrate the relevant aspects of the preferred embodiments and are not necessarily drawn to scale.

DETAILED DESCRIPTION OF ILLUSTRATIVE EMBODIMENTS

The making and using of the presently preferred embodiments are discussed in detail below. It should be appreciated, however, that the present invention provides many applicable inventive concepts that can be embodied in a wide variety of specific contexts. The specific embodiments discussed are merely illustrative of specific ways to make and use the invention, and do not limit the scope of the invention.

The present invention will be described with respect to preferred embodiments in a specific context, namely filters for use in EUV lithography systems. The invention may also be applied, however, to other applications that require filters, such as in other semiconductor lithography systems or in other systems with optical devices that need protection from debris.

The novel debris mitigation device or filter in accordance with embodiments of the present invention comprises a highly EUV transparent yet stable nanotube material sandwiched between two layers of structurally supportive, highly EUV transparent thin layers. This sandwich structure is further supported structurally by a stabilizing frame patterned in a supportive grid disposed on either side of the highly EUV transparent thin layers. The sandwich structure embedded in the stabilizing frame can be produced by using standard thin film technology, processing, and patterning, similar to technology that has been developed for producing free standing stencil masks for electron and ion projection lithography, for example. The filter does not have to meet stringent manufacturing requirements, such as the requirements for making electron or ion projection lithography masks, so the novel filters are inexpensive to manufacture, and can be considered as consumable parts of the EUV source or of the EUV lithography system, to be replaced or refurbished occasionally or frequently.

The filter material selections and dimensions may be chosen and tuned so the novel filter described herein is adapted to function as a debris filter, a spectral purity filter, or both.

Figure 1:
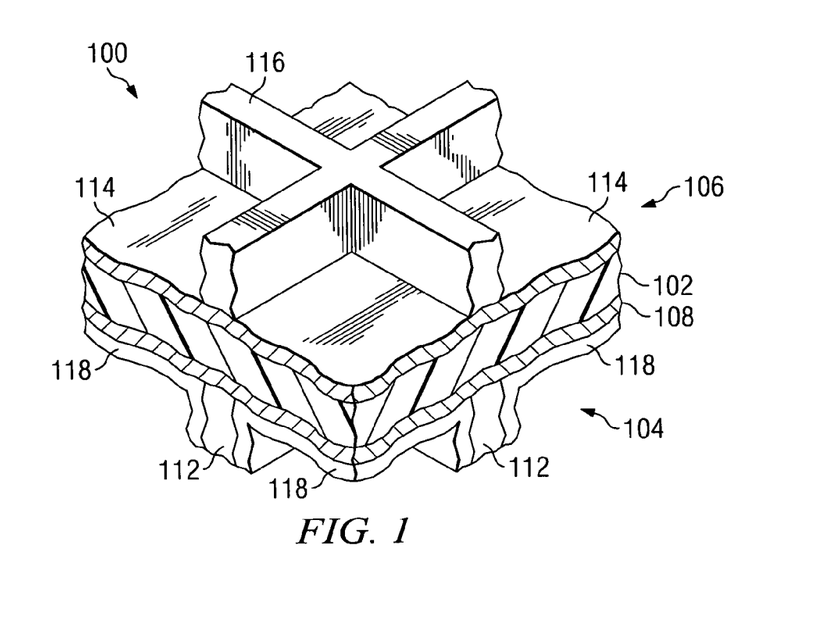
FIG. 1 shows a perspective view of a cell of a filter in accordance with an embodiment of the present invention comprising a nanotube material having a thin supportive EUV transparent material and a support grid disposed on both sides.

Referring first to FIG. 1, a cell 100 of a filter in accordance with an embodiment of the invention is shown in a perspective view. A first material layer 102 preferably comprising a nanotube material is sandwiched between a second material layer 108 and a fourth material layer 114 that comprise highly EUV transparent thin layers. Note that the material layers 102, 108, 112, 114, 116 and 118 are referred to as first, second, third, fourth, fifth, and sixth material layers, respectively, not in the order introduced here, but rather, in the order of introduction in the claims section that follows. The second material layer 108 and fourth material layer 114 provide structural support for the first material layer 102.

A patterned third material layer 112 and an optional patterned fifth material layer 116 are disposed on either side of the second material layer 108 and the fourth material layer 114, respectively. The third material layer 112 and the fifth material layer 116 preferably comprise a rigid material patterned in a grid of struts that provides a stabilizing frame for the sandwich structure comprised of the first material layer 102, the second material layer 108, and the fourth material layer 114. An optional sixth material layer 118, which provides additional protection from damage from debris, may be deposited over the patterned third material layer 112 and exposed second material layer 108, as shown, or on the optional patterned fifth material layer 116 and exposed fourth material layer 114 (not shown in FIG. 1; see FIG. 11).

Preferred material properties, materials, and dimensions for the material layers 102, 108, 112, 114, 116, and 118 will next be described. Generally, the materials used for fabrication of the filter are preferably capable of withstanding high thermal loads.

The first material layer 102 preferably comprises a material that is substantially transparent to a first wavelength of light. The first wavelength of light preferably comprises EUV light, e.g., light or radiation having a wavelength of about 10 to 15 nm. In one embodiment, the first wavelength of light comprises about 13.5, for example. For other applications other than EUV lithography, however, the first wavelength of light may comprise other wavelengths, for example. Preferably, the first material layer 102 comprises a material that is at least 80% transparent to the first wavelength of light, and more preferably, the first material layer 102 comprises a material that is about 95 to 100% transparent to the first wavelength of light, as examples.

The first material layer 102 preferably comprises a nanotube material. The nanotube material preferably comprises a carbon, silicon nitride, or boron nitride containing material, as examples, although alternatively, the nanotube material may also comprise other materials. The nanotube material may comprise a mesh, and may be opaque to visible light, for example. The nanotube material preferably has a high transparency for EUV light, in one embodiment. The first material layer 102 is preferably substantially transparent to the first wavelength of light. The nanotube material of the first material layer 102 is preferably relatively thin, yet strong. The first material layer 102 preferably comprises a commercially available nanotube material, for example. Nanotube materials are also referred to as "nanotube papers," as an example. The nanotube material comprises one or more layers of a plurality of nanotube fibers, and may be deposited in a reactor using chemical vapor deposition (CVD) or other deposition techniques, for example.

The first material layer 102 preferably comprises a thickness of about 10 to 500 nm, and more preferably comprises a thickness of about 50 to 300 nm, as examples, although alternatively, the first material layer 102 may comprise other dimensions. In one embodiment, for example, the first material layer 102 comprises a thickness of about 100 nm. The thickness of the first material layer 102 comprising the nanotube mesh layer is preferably selected for optimal EUV transmission while still being dense enough to stop debris from reaching EUV light source mirrors, for example, in one embodiment.

The second material layer 108 and the fourth material layer 114 preferably comprise materials that are highly transmissive to the first wavelength of light, for example. In particular, the second material layer 108 and the fourth material layer 114 preferably comprise a material that is substantially transparent to the first wavelength of light. Preferably, the second material layer 108 and the fourth material layer 114 comprise a material that is at least about 80% transparent to the first wavelength of light, and more preferably, the second material layer 108 and the fourth material layer 114 comprise a material that is about 95 to 100% transparent to the first wavelength of light, as examples.

The second material layer 108 and the fourth material layer 114 preferably comprise a material that is structurally strong, in order to provide mechanical support for the first material layer 102, for example. The second material layer 108 and the fourth material layer 114 preferably comprise zirconium, silicon nitride, boron nitride, silicon carbide, as examples, although alternatively, the second material layer 108 and the fourth material layer 114 may also comprise other materials or combinations of materials, e.g., multiple layers of materials. The second material layer 108 and the fourth material layer 114 may also comprise other materials that are transparent to EUV light, for example.

The second material layer 108 and the fourth material layer 114 preferably comprise a thickness of about 100 nm or less, and more preferably, comprise a thickness of about 15 to 75 nm, as examples, although alternatively, the second material layer 108 and the fourth material layer 114 may comprise other dimensions. In one embodiment, the second material layer 108 and the fourth material layer 114 comprise a thickness of about 25 nm, as an example.

In one embodiment, the second material layer 108 and the fourth material layer 114 preferably comprise a material that has high UV absorption and good band pass for EUV radiation, so that if there is out of band radiation the second material layer 108 and the fourth material layer 114 assist in filtering it. For example, the second material layer 108 and the fourth material layer 114 may comprise zirconium or silicon nitride, in this embodiment.

The second material layer 108 and the fourth material layer 114 also function as an adhesive between the first material layer 102 and the third material layer 112, and the optional fifth material layer 116, if included. Furthermore, the second material layer 108 and the fourth material layer 114 may function as a spectral filter. For example, if the second material layer 108 and the fourth material layer 114 comprise zirconium, zirconium acts as a spectral filter. Thus, Zr is a preferred material for the second material layer 108 and the fourth material layer 114 in one embodiment, e.g., where the filter is adapted to provide spectral purity filtering of wavelengths of light other than the first wavelength of light. Selecting materials like zirconium to sandwich the first material layer 102 provides the additional advantage of reducing out of EUV-band radiation significantly. Thus, the novel filter 120 (see FIG. 2) described herein can be easily adjusted for use as an EUV spectral purity filter.

The fourth material layer 114 may comprise the same material as the second material layer 108, or alternatively, may comprise a different material than the second material layer 108, for example. The material layer 114 or 108 closest to a EUV light source is preferably a heat-resistant material, and the other material layer 108 or 114 may comprise a spectral filter, for example.

Figure 5:
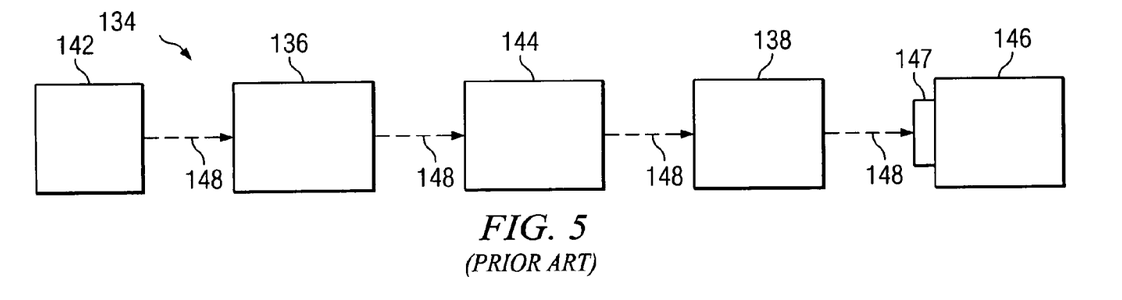
FIG. 5 is a block diagram of a portion of a prior art EUV lithography system.

The patterned third material layer 112 and the optional patterned fifth material layer 116 preferably comprise a material that resists erosion from the debris generated by an EUV light source, such as EUV light source 142 shown in FIG. 5, to extend the lifetime of the filter. Referring again to FIG. 1, the third material layer 112 and the fifth material layer 116 comprise a rigid grid structure on the first side 104 and the second side 106 of the first material layer 102, providing structural support. For example, the heat load may be significant, particularly when the filter is used close to an EUV light source 142, and the struts of the patterned third material layer 112 and the patterned fifth material layer 116 provide mechanical support for the filter 120 during the thermal exposure.

The third material layer 112 and the fifth material layer 116 preferably comprise silicon nitride, boron nitride, silicon carbide, silicon, silicon with an insulating layer such as an oxide disposed thereon, or combinations or multiple layers thereof, as examples, although alternatively, the third material layer 112 and the fifth material layer 116 may comprise other materials. The third material layer 112 and the fifth material layer 116 preferably comprise a thickness of about 5 mm or less, for example, although the third material layer 112 and the fifth material layer 116 may alternatively comprise other dimensions. For example, the third material layer 112 and/or the fifth material layer 116 may be deposited and etched back to remove a portion of the material to achieve a desired strut height. Alternatively, the third material layer 112 and/or the fifth material layer 116 may be deposited in the desired thickness. The third material layer 112 and/or the fifth material layer 116 may comprise a semiconductor wafer, for example, that is patterned to form support struts.

The pattern of the third material layer 112 and the optional fifth material layer 116 preferably comprises an array of struts, as shown. The pattern of the struts may comprise a square grid, as shown, and alternatively may comprise other patterns, such as triangular, rectangular, circular, octagonal, trapezoidal, a plurality of zig-zag or S-shaped lines, a honeycomb, or combinations thereof, as examples, although the pattern of the struts may alternatively comprise other shapes, as well. The third material layer 112 and/or the fifth material layer 116 comprise support structures that absorb the EUV light or radiation, and therefore the number of struts in the patterns of these layers is preferably minimized in accordance with an embodiment of the present invention. The novel first material layer 102 comprising a nanotube material, sandwiched between the second material layer 108 and the fourth material layer 114, minimize absorption by the supportive grid formed by the struts of the third material layer 112 and fifth material 116, while the supportive grid formed by the struts of the third material layer 112 and fifth material 116 provide the intrinsic structural support needed to support the large nanotube mesh of the first material layer 102.

The nanotube fibers of the first material layer 102 are very small. In one embodiment, preferably at least one fiber lies beneath at least one of the struts of the third material layer 112 and/or the optional fifth material layer 116. If the fibers reside under the struts, stability is achieved, while reducing transparency of the filter very little. The nanotube fibers of the first material layer 102 may be several mm in length, or greater. Preferably each fiber of the first material layer 102 is tied down by one type of strut feature. Preferably, the maximum distance between the struts of the patterned third material layer and the fifth material layer is the length of the nanotube fibers in the first material layer, in one embodiment; e.g., if the fibers are shorter, then the struts are preferably positioned closer together, and if the fibers are longer, the struts of the third material layer 112 and/or the optional fifth material layer 116 may be spaced farther apart, increasing the transmissiveness of EUV light in the system.

Figure 11:
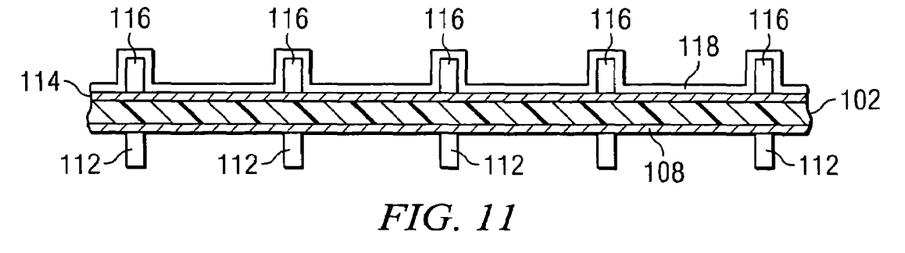

The optional sixth material layer 118 provides additional protection from damage from debris, and may be deposited over the patterned third material layer 112 and exposed second material layer 108, as shown, or on the optional patterned fifth material layer 116 and exposed fourth material layer 114 (not shown in FIG. 1; see FIG. 11). A sixth material layer 118 may be deposited over both the patterned third material layer 112 and exposed second material layer 108, and also over the patterned fifth material layer 116 and exposed fourth material layer 114, for example. The sixth material layer 118 may comprise similar materials and thicknesses as the materials used for the second material layer 108 and fourth material layer 114, for example. The sixth material layer 118 may comprise about 100 nm or less of zirconium, silicon nitride, boron nitride, or silicon carbide, for example.

The sixth material layer 118 may be deposited at the time the filter 120 is manufactured (see FIG. 2), in one embodiment. However, in another embodiment, the sixth material layer 118 may be deposited after a filter 120 has been used for a period of time. For example, after a period of use, a filter 120 may exhibit wear and damage. The struts of the third material layer 112 may begin to erode and become shorter, and the exposed second material layer 108 may begin to decrease in thickness, particularly if the filter 120 is placed close to an EUV light source 142 (see FIG. 6). The filter 120 may be refurbished, extending its lifetime, by removing the filter 120 from the system 140 (see FIG. 6), cleaning it, and depositing a sixth material layer 118 over the surface of the eroded third material layer 112 struts and the eroded second material layer 108. Preferably the additional protective sixth material layer 118 is deposited over the side 104 or 106 of the filter that faces the EUV light source 142, for example.

Figure 2:
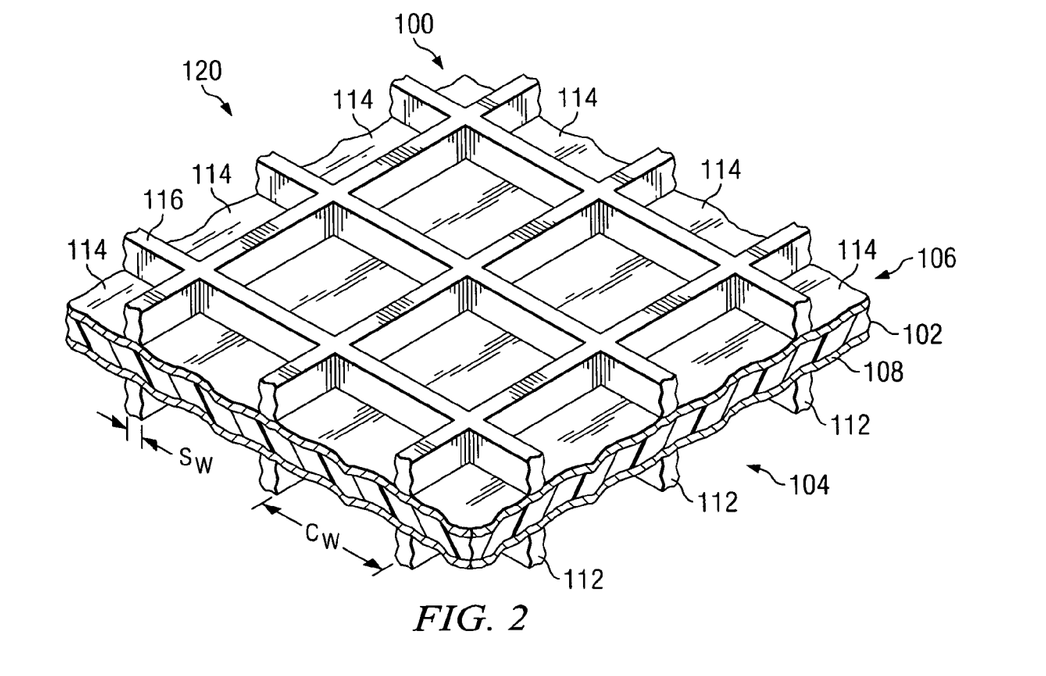
FIG. 2 shows a perspective view of a filter in accordance with an embodiment of the present invention, comprising an array of filter cells shown in FIG. 1.

FIG. 2 illustrates a perspective view of filter 120 or debris mitigation device in accordance with an embodiment of the present invention, comprising a plurality of the filter cells 100 shown in FIG. 1 arranged in an array. The ratio between cell width $C_w$ and strut width $S_w$ is preferably selected such that absorption by the strut material (e.g., patterned third material layer 112 and/or patterned fifth material layer 116) is minimized, and such that the cell size, e.g., the cell width $C_w$ is comparable to the average length of individual nanotubes in the first material layer 102 comprising the nanotube mesh.

Figure 9:
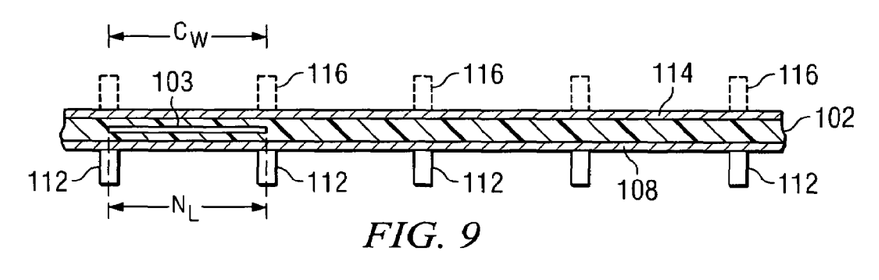

For example, referring to the cross-sectional view shown in FIG. 9, an individual nanotube 103 within the first material layer 102 is shown, having a length $N_L$. If the nanotube length $N_L$ comprises a few millimeters, the cell width $C_w$ may be in the order of about 1 mm in length, and the strut width $S_W$ (see FIG. 2) is preferably in the order of about 10 µm, which results in no more than about 2% EUV light absorption by the grid struts of the third material layer 112 or the fifth material layer 116. EUV absorption by the supporting grid structure of the third material layer 112 or the fifth material layer 116 may be minimized by designing the open area between the gird struts and the width of the grid struts (strut width in $S_w$ in FIG. 2) such that absorption by the grid structure formed by the third material layer 112 and/or the fifth material layer 116 is around 2%. In this embodiment, the ratio of $C_w$ to $S_w$ is about 90:1, assuming square cells for simplicity: i.e., if the strut width $S_w$ is about 10 µm, then the cell width $C_w$ is about 0.9 mm. Because nanotubes can be fabricated that are about a millimeter in length, the majority of nanotubes will cross underneath a strut area as long as the cell width $C_w$ is in the same order of magnitude as the nanotube length $N_L$.

Referring again to FIG. 9, in one embodiment, the nanotube fibers 103 in the first material layer 102 comprise a first length $N_L$, and the distance between two adjacent struts of the patterned third material layer 112 and/or patterned fifth material layer 116 comprise a second length $C_w$. The first length $N_L$ preferably is greater than or equal to the second length $C_w$ so that the individual nanotubes fibers 103 are sufficiently supported in the structure, for example.

Figure 3:
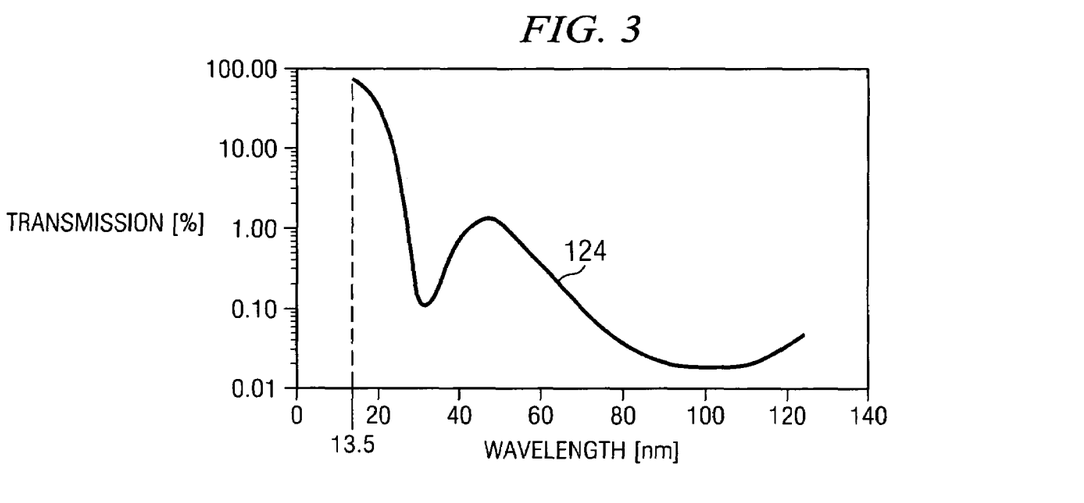
FIG. 3 is a graph showing a calculation of the transmission of the filter in accordance with an embodiment of the present invention, wherein over 70% transmission is achieved at a wavelength of 13.5 nm.

FIG. 3 shows a graph 124 of a calculation of light transmission as a function of wavelength of a filter 120 shown in FIG. 2 in accordance with an embodiment of the present invention. The filter 120 design included a second material layer 108 comprising 25 nm of Zr, a first material layer 102 comprising 100 nm of carbon nanotube mesh having a density of 0.5 g/cm$^3$, and a fourth material layer 114 comprising 25 nm of Zr. The effects of the third material layer 112 and the fifth material layer 116 were disregarded for the purposes of the calculation. Advantageously, the calculated transmission at an EUV wavelength of 13.5 nm is above 70%, and the transmission for higher wavelengths is significantly reduced. The program used for the calculation, which is incorporated herein by reference, was developed by Eric Gullikson form Lawrence Berkeley National Laboratory and may be found at the website: http://www.cxro.lbl.gov/optical_constants/filter2.html. By increasing the zirconium layer thickness (e.g., layers 108 and 114) and reducing the nanotube mesh layer thickness (layer 102), a higher EUV transmission can be achieved for the filter 120 to function as a wavelength filter for EUV only, possibly with reduced debris mitigation, in one embodiment.

Thus, in one embodiment, such as the one the calculations are shown for in FIG. 3, the first material layer 102 of the filter 120 preferably comprises a carbon nanotube mesh layer having a thickness of about 100 nm having a density of about 0.5 g/cm$^3$ and an EUV transmission of greater than about 86%. This density is great enough to stop debris from passing through the filter 120, for example. The second material layer 108 and the fourth material layer 108 preferably comprise zirconium layers having a thickness of about 25 nm thickness and a greater than 91% EUV transmission. The transmission of EUV light through the sandwich e.g., layers 108/102/114 in this embodiment, would be about 71%, which is advantageously high compared to EUV light transmission using prior art debris mitigation devices and methods.

Figure 4:
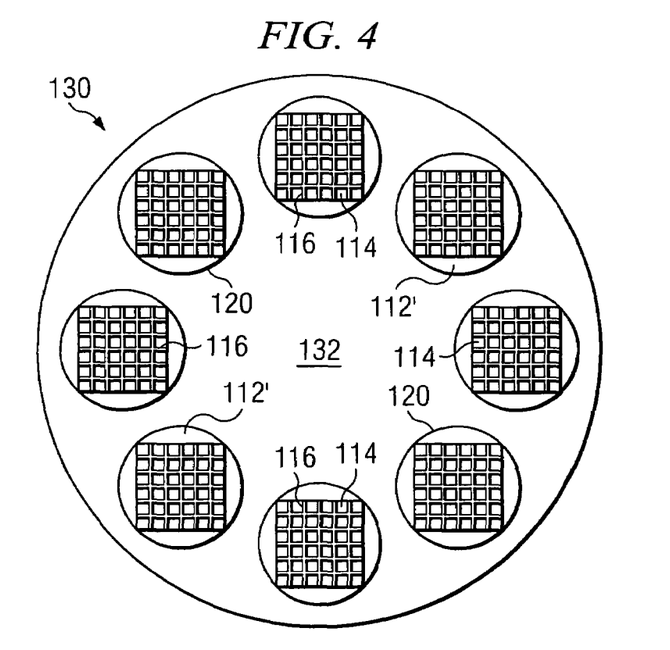
FIG. 4 shows a filter device comprising a plurality of filters in accordance with an embodiment of the present invention.

The filter 120 preferably comprises a low-cost device; e.g., the cost of the materials and method of manufacture are relatively inexpensive. Thus, the filter 120 may be a consumable device. For example, the filter 120 may be disposed in an EUV lithography system in a disposable, replaceable configuration. In one embodiment, a plurality of filters 120 may be disposed on a support 132 such as a rotatable wheel to form a filter device 130, as shown in FIG. 4. The filters 120 may comprise a disk shape, as shown, although the filters 120 may comprise other shapes, to be described further herein. The support 132 of the filter device 130 may be circular, as shown, and alternatively may comprise other shapes, such as a square, oval, octagon, pentagon, or others, as examples. The filter device 130 may be rotatable about a central axis, for example.

Note that a top view of each filter 120 is shown in FIG. 4. The filters 120 are disposed on, e.g., mounted on or attached to the support 132 of the filter system 130. If the filter 120 was manufactured from a 4 inch wafer, the filter 120 may comprise a diameter of about 100 mm, for example. The filter 120 may comprise a central region (having a generally square shape in FIG. 4) of patterned fifth material layer 116 exposed, and unpatterned underlying fourth material layer 114 also exposed at the top surface. The filter 120 may comprise a window of about 5×5 cm of patterned fifth material layer 116 exposed, if a 4 inch wafer were used to manufacture the filter 120, for example, although the window may also comprise other dimensions. On the bottom surface, not visible, the patterned third material layer 112 comprises a similar pattern as the patterned fifth material layer 116, and may also include edge regions 112' of unpatterned third material layer 112, as shown. The filter device 130 may be adapted to be attached, fit, or inserted into an EUV lithography system 140, as shown in FIG. 6.

FIG. 5 is a block diagram of a portion of a prior art EUV lithography system 134. The system 134 includes an EUV light source 142 adapted to generate EUV light 148. A prior art debris mitigation device 136 is disposed between the EUV light source 142 and a collector 144. A spectral purity filter 138 is disposed between the collector 144 and the exposure area 146 that includes a first mirror 147. Generally, the EUV light source 142, the debris mitigation device 136, the collector 144, and the spectral purity filter 138 are often contained in a unit referred to in the art as a "EUV source." The EUV source is adapted to direct the EUV light 148 towards an exposure area 146 which includes a first mirror 147, as shown. The exposure area 146 typically includes illumination optics that shape the incoming EUV light 148 to the desired illumination condition, e.g., disk illumination, annular illumination, and/or dipole illumination; a mask; and projection optics adapted to reduce the mask image onto a wafer, as examples, not shown.

EUV lithography is preferably performed in a vacuum environment due to the absorption of EUV photons by most gases, for example. Because prior art debris mitigation device 136 lets a substantial of amount of debris pass through, component damage is exhibited at the collector 144, spectral purity filter 138, and the first mirror 147 of the exposure area 146, caused by plasma generated debris via sputtering, and potential sputtering oxidation and deposition. The damage to these EUV source components 144, 138, and 147 reduces their lifetime. Furthermore, the EUV light transmission is reduced by the debris mitigation device 136 to an unacceptable level, e.g., about 40%. In addition, the system 134 requires a separate spectral purity filter 138, as shown.

Figure 6:
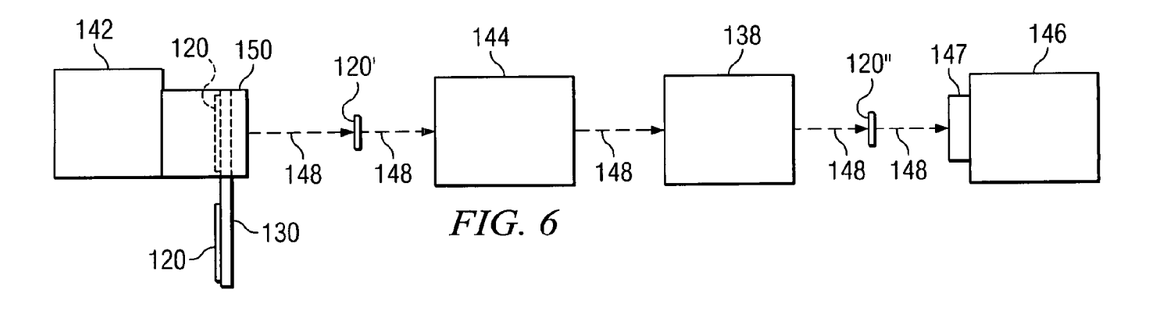
FIG. 6 is a block diagram of a portion of an EUV lithography system including the novel filter of the present invention implemented in the system at various locations.

FIG. 6 illustrates a portion of a novel lithography system 140 that includes the novel filter 120, 120' and 120" described herein, in accordance with a preferred embodiment of the present invention. The EUV lithography system 140 includes an EUV light source 142 adapted to generate EUV light 148. Because the EUV light source 142 generates debris, a filter 120 is positioned between the EUV light source 142 and a collector or collection optics system 144, which is adapted to collect the EUV light 148 generated by the EUV light source 142, in a preferred embodiment.

The filter 120 is preferably placed relatively close to the EUV light source 142, as shown. The collection optics system 144 is adapted to transmit the EUV light 148 to an exposure area 146 comprising a first mirror 147. The exposure area 146 may contain a reflection lithography mask and a support for a substrate to be patterned (not shown), for example. The first mirror 147 may comprise a first condenser mirror of an EUV lithography optical system 146, for example. The EUV light source 142, the filter 120, and the collection optics system 144 may comprise an EUV source, in one embodiment. In another embodiment, an EUV source including an EUV light source 142, filter 120, and collection optics system 144 may optional also include filter 120', spectral purity filter 138, and/or filter 120", for example.

Referring again to FIG. 1, in one embodiment, the filter 120 preferably comprises both the second material layer 108 and the fourth material layer 110 disposed on either side of the first material layer 102, and also comprises the patterned third material layer 112 and the patterned fifth material layer 116 disposed on either side of the second material layer 108 and the fourth material layer 110, as shown. When the filter 120 is used in close proximity to an EUV light source 142, as shown in FIG. 6, the filter 120 may experience high temperatures generated by the EUV light source 142. The EUV light source 142 generates high power, e.g., close to the kW range, which is significant. The patterned third material layer 112 and the patterned fifth material layer 116 disposed on either side of the first material layer 102 function as a heat sink and also to prevent the filter 120 from deforming excessively from the heat exposure. However, in another embodiment, the filter 120 may include only the first material layer 102, the second material layer 108, the third material layer 112, and the fourth material layer 114. In this embodiment, the patterned third material layer 112 is preferably disposed in an EUV lithography system with the first material layer 102 facing the incoming EUV light 148, so that the patterned third material layer 112 is positioned upstream along the EUV light 148 path, and is thus adapted to provide mechanical support for the front side or the upstream side of the filter 120.

Figure 7:
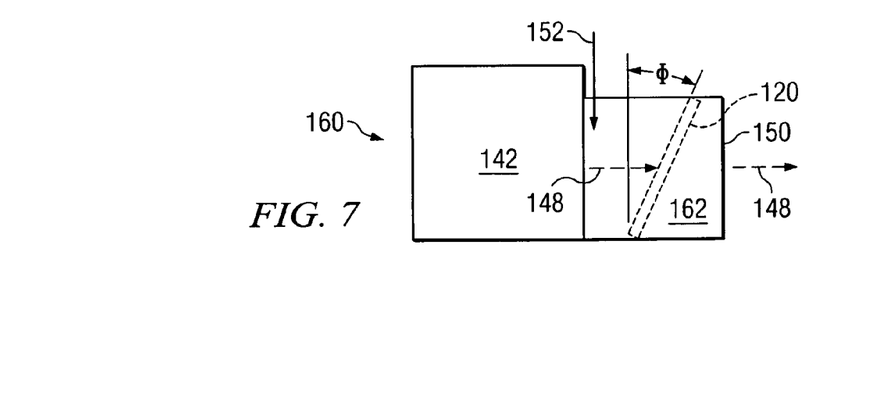
FIG. 7 illustrates an EUV source that includes the filter in accordance with an embodiment of the present invention, wherein the filter is positioned at an angle with respect to normal, proximate an EUV light source.

The EUV light source 142 and the filter 120 may be disposed within a sealed area 150, as shown in FIG. 6 and in more detail in FIG. 7, to prevent the debris from entering the other areas and components of the lithography system 140. The sealed area 150 may include an inert gas disposed on the side of the filter not facing the EUV light source 142, such as Ar. The pressure differential on both sides of the filter 120 can be adjusted in this embodiment, by using the background gas 162, e.g., by increasing or decreasing the pressure of the gas 162. Preferably the inert gas 162 used does not absorb EUV light 148, but does absorb other wavelengths, for example.

Referring again to FIG. 6, if the filter 120 is disposed on a filter device 130, when or if the filter 120 becomes damaged after use of the EUV lithography system 140, the filter device 130 can be revolved or spun to position another, unused filter 120 between the EUV light source 142 the collection optics 144. Alternatively, a single filter 120 may be inserted into the system 140 to replace a damaged filter 120, not shown.

The filter 120 may be used in combination with other debris mitigation devices. For example, in one embodiment, an optional gas flow or gas curtain 152 may be directed over the output of the EUV light source 142, as shown in FIG. 7, to reduce the amount of debris leaving the EUV light source 142. While generally not very effective when used to filter debris alone, because a gas curtain 152 cannot remove much of the debris generated by the EUV light source 142, the optional gas curtain 152, other debris mitigation device, or electromagnetic (E&M) mitigation device (not shown) can reduce the amount of debris so that the filter 120 is more effective in terms of cost, i.e., the filter 120 will not have to be replaced or refurbished as often. The gas curtain 152 may comprise helium gas that is blown in front of the EUV light source 142 at the output, for example, sweeping away a portion of the debris generated by the EUV light source 142, and the filter 120 prevents the remaining debris from reaching the collection optics system 144, in this embodiment.

Referring again to FIG. 6, advantageously, the novel filter 120 may also be used in other locations within the EUV lithography system 140. In addition to being placed close to the EUV light source 142, as shown at 120, a filter 120' may also be placed farther down the path of the EUV light 148, at the entry of the collection optics system 144, as shown. Alternatively, or in addition, a filter 120" may be placed between the collection optics system 144 and the exposure area 146. The filters 120, 120', and 120" may comprise the same materials or different materials, for example.

The filter 120 may function as a filter in extremely dirty regions within an EUV lithography system 140, e.g. when placed at the output of the EUV light source 142, in some embodiments. However, in other embodiments, the filter 120 may also function as a spectral purity filter, as shown at 120". In this embodiment, the first material layer 102, second material layer 108, and fourth material layer 114 (see FIG. 1) materials are selected to provide spectral purity filtering for the EUV light 148. The second material layer 108 and the fourth material layer 114 that sandwich the first material layer 102 may comprise Zr in this embodiment, for example. The filter 120" may be used in a position within the EUV lithography system 140 wherein the wavelengths of light are selected. The filter 120" may be adapted to filter out non-EUV wavelength, for example. Thus, the novel filter 120 is dual-purpose and provides both debris and spectral light filtering. The use of a separate spectral light filter 138 may be eliminated in this embodiment. One or more filters 120 may be used in an EUV lithography system 140 in accordance with embodiments of the present invention.

Referring again to FIG. 7, in one embodiment, the angle φ between the filter 120 and the incoming debris flux is preferably chosen such that erosion of the filter 120 itself is minimized, i.e., such that the non-normal incidence of debris with respect to the debris mitigation device reduces erosion and sputtering of the filter 120. The angle φ may comprise an angle of about 0 to 30 degrees, for example, although alternatively, the angle φ may comprise other angles.

Embodiments of the present invention include an EUV source 160 shown in FIG. 7 that includes a filter 120 described herein that functions as a debris filter. Alternatively, the filter 120" may be placed within a portion of an EUV lithography system 140 as shown in FIG. 6, spaced apart from an EUV source 142, rather than being integral to the EUV source 160, as shown in FIG. 7.

Again, as described earlier herein, if the filter 120 begins to erode, or suffers from an excessive amount of erosion, the filter 120 side 104 or 106 (see FIG. 1) that faces the EUV light source 142 may be coated with a protective sixth material layer 118, comprising a highly transmissive material such as Zr, thus extending the lifetime of the filter 120 and reducing overall cost. The sixth material layer 118 counters erosion of the underlying materials, and is sacrificially eroded, while being highly transmissive of EUV light.

The filter 120 may be recoated with an additional sixth material layer 118 as the sixth material layer 118 is eroded away, for example. Note that the supporting grid structure of the patterned third material layer 112 and/or fifth material layer 116 may be coated with the sixth material layer 118, because the patterned third material layer 112 and/or fifth material layer 116 are not very transparent to EUV, because of the large thickness of the third material layer 112 and/or fifth material layer 116.

Figure 8:
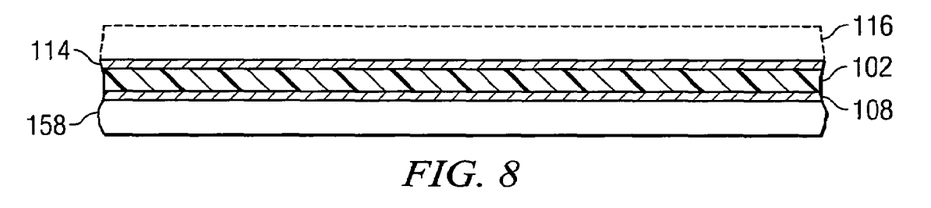
FIGS. 8 and 9 show cross-sectional views of a filter in accordance with an embodiment of the invention at various stages of manufacturing.

FIGS. 8 and 9 show cross-sectional views of a filter at various stages of manufacturing in accordance with an embodiment of the present invention. The same numerals are used as reference numbers for the various elements shown in FIGS. 7 through 8 as were used in the previous figures.

Referring to FIG. 8, to manufacture the filter 120 in one embodiment, a wafer 158 is provided. The wafer 158 may comprise a semiconductor substrate comprising silicon or other semiconductor materials covered by an insulating layer, for example. The wafer 158 may comprise silicon oxide over single-crystal silicon, for example. The wafer 158 may include other conductive layers or material layers. Compound semiconductors, GaAs, InP, Si/Ge, or SiC, as examples, may be used in place of silicon, for example. The wafer may comprise 4 or 6 inch wafers, as examples, although alternatively, the wafers may comprise other sizes.

A plurality of material layers are then deposited over the wafer 158, and some of the layers are patterned to manufacture the filter 120. In one embodiment, the wafer 158 may comprise the third material layer 112. In another embodiment, the wafer 158 provides a support for the other material layers deposited, and the wafer 158 is removed and discarded after the filter 120 is manufactured.

If only one side of the first material layer 102 has material layers disposed thereon (e.g., either 108 and 112, or 114 and 116), then preferably, in one embodiment, a wafer 158 is provided. The wafer 158 will comprise the third material layer 112 after it is patterned, in this embodiment. The second material layer 108 is formed over and abutting the wafer 158, and the first material layer 102 is deposited over and abutting the second material layer 108. The fourth material layer 114 is deposited over and abutting the first material layer 102. The wafer 158 may be thinned to a particular thickness, if needed. The wafer 158 is then patterned to form the patterned third material layer 112, as shown in FIG. 9. The wafer 158 may be patterned using standard inexpensive low resolution patterning technologies, such as low resolution lithography, e.g., i-line or g-line lithography and etching techniques, although alternatively, other patterning methods may also be used. Advantageously, the second material layer 108, the first material layer 102, and the third material layer 114 are strong enough so that the wafer 158 material may be patterned, for example.

In this embodiment, if a fifth material layer 116 is to be included, after depositing the fourth material layer 114, the fifth material layer 116 may be deposited over and abutting the fourth material layer 114, as shown in phantom in FIG. 8. After the fifth material layer 116 is deposited, it is patterned, also preferably using a direct patterning method, although other patterning methods may also be used, leaving the structure shown including the patterned fifth material layer 116 on the other side of the fourth material layer 114, as shown in phantom in FIG. 9.

Figure 10:
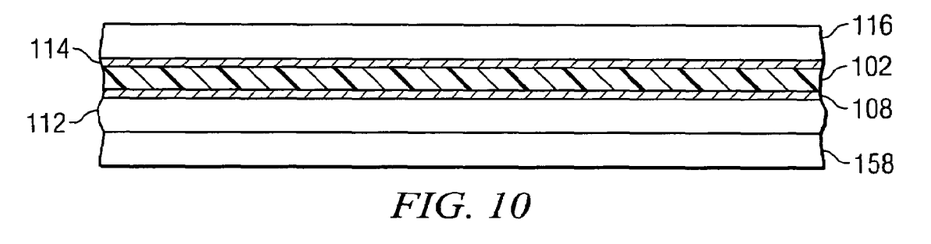
FIGS. 10 and 11 show cross-sectional views of a filter in accordance with another embodiment of the invention at various stages of manufacturing, wherein an additional protective material layer is included that is transmissive to EUV light.

FIGS. 10 and 11 show cross-sectional views of a filter 120 at various stages of manufacturing in accordance with another embodiment of the present invention. In this embodiment, a wafer 158 is used as a sacrificial device, as a support. After the other material layers 112, 108, 102, 114, and 116 have been deposited, the wafer 158 is removed and discarded, or possibly reused, for example.

Referring to FIG. 10, the third material layer 112 is deposited over the wafer 158, the second material layer 108 is deposited over the third material layer 112, and the first material layer 102 is deposited over the second material layer. The fourth material layer 114 is deposited over the first material layer 102, and an optional fifth material layer 116 is deposited over the fourth material layer 114. If present, the fifth material layer 116 is then patterned, and the wafer 158 is removed. The third material layer 112 is then patterned.

Note that in this embodiment, the third material layer 112 may be omitted, and the second material layer 108 may be deposited directly on the wafer 158, if a fifth material layer 116 is included.

Figure 12:
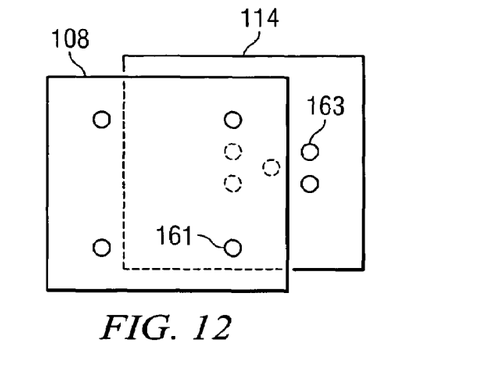
FIG. 12 shows an embodiment, wherein the second material layer and the fourth material layer of the filter comprise a plurality of apertures.

FIG. 12 illustrates that the second material layer 108 and the fourth material layer 114 may comprise a plurality of apertures 161 and 163, respectively. Preferably, the apertures 161 in the second material layer 108 are located in different positions than the apertures 163 in the fourth material layer 114, so that debris is not allowed to pass through the filter 120 (see FIG. 2); e.g., preferably, the apertures 161 and 163 are not aligned. The apertures 161 and 163 allow the filter 120 to handle vacuum fluctuations, so that the pressure is the same at the front of the filter 120 as at the back of the filter 120, for example. Note that if apertures 161 and/or 163 are disposed on the filter 120, preferably another material layer has apertures 161 and/or 163 in different locations to ensure there is no debris transmission.

Figure 13:
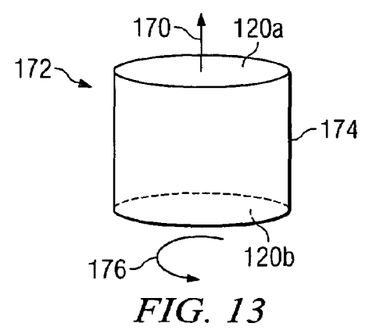
FIG. 13 shows an embodiment wherein the filter comprises a cylinder.

FIG. 13 shows an embodiment of the present invention, wherein a filtering device 172 comprises a cylindrical shape. The filtering device 172 comprises a cylindrical portion 174, a first filter 120*a* described with reference to FIG. 2 herein disposed at one end of the cylindrical portion 174, and a second filter 120*b* is disposed at the other end of the cylindrical portion 174. The cylindrical portion 174 preferably comprises similar materials as the first filter 120*a* and second filter 120*b*, in one embodiment. For example, the cylindrical portion 174 preferably comprises a nanotube material sandwiched by two material layers, and at least one supportive material disposed on one side. The cylindrical portion 174 preferably comprises a first material layer 102, a second material layer 108, a fourth material layer 114, a patterned third material layer 112, and optionally may include a patterned fifth material 116 and an optional sixth material layer 118. The cylindrical portion 174 may also comprise a heat-resistant material such as silicon or silicon nitride, as examples, although alternatively, the cylindrical portion 174 may comprise other materials, that functions primarily to connect the first filter 120*a* and the second filter 120*b*, rather than functioning as a filter, for example.

In this embodiment, the cylindrical filter device 172 may be rotated during use, e.g., in a direction 176. Rotating the filter device 172 decreases the thermal load of the filter device 172. A fluid 170 comprising a gas or liquid may be used to cool the filter. The fluid 170 preferably comprises a cooling agent that is substantially transparent to and has little absorption of EUV light, such as He, for example, although other fluids may alternatively be used.

The materials of the filters 120*a* and 120*b* may be optimized according to their position within a EUVL system (see FIG. 6), for example. If the filter 120*a* is disposed closer to the EUV light source 142 than filter 120*b*, the filter 120*a* may comprise materials that are more heat resistant, for example, and the filter 120*b* may comprise material that provide EUV filtering, in one embodiment. The filter 120*a* closer to the EUV light source may comprise material layers that are easy to bend, replace and cool, for example. Filter 120*b* may be more focused on spectral filtering, and may comprise Zr film with no fifth material layer 116, for example. Suitable combinations of filters 120*a* and 120*b* may be used, based on practice issues, such as thermal load, amount of debris, and distance between the filters 120*a* and 120*b* from a EUV light source, for example.

Figure 14:
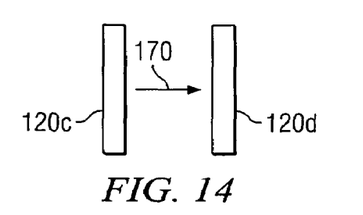
FIG. 14 illustrates that a fluid may be used to cool the filters.

Again, one or more filters 120*c* and 120*d* may be used in an EUVL system, for example, as shown in FIG. 14. A fluid 170 may be passed from one filter 120*c* to another filter 120*d*, to cool the filters 120*c* and 120*d* during operation, for example.

Figure 15:
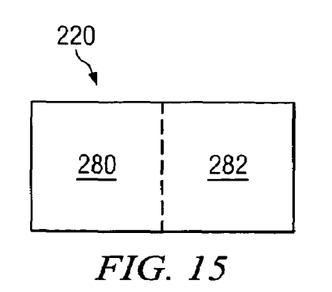
FIG. 15 shows an embodiment of the present invention, wherein the filter comprises a first region and a second region, wherein if the first region becomes too hot, the filter can be moved to place the second region in the path of the EUV light.

In one embodiment, as shown in FIG. 15, a filter 220 may comprise a first region 280 and a second region 282. The filter 220 preferably comprises the material layers described with reference to filter 120 shown in FIGS. 1 and 2, for example. The first region 280 and/or the second region 282 may include a plurality of apertures (not shown), as described with reference to FIG. 12. The plurality of apertures accommodate for vacuum fluctuations in an EUV lithography system. The plurality of apertures makes the filter 220 less likely to break during vacuum fluctuations, for example. The temperature of the filter 220 may be monitored, and if the temperature exceeds a predetermined temperature during use of the first region 280, the filter 220 may be moved so that the second region 282 is placed in the path of the EUV light 148 (see FIG. 6), for example.

Figure 16:
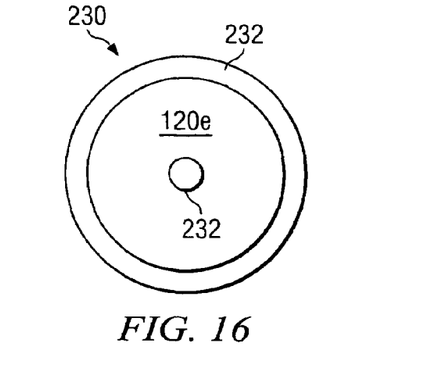
FIG. 16 illustrates another embodiment, wherein the filter is continuous and disposed on a rotatable wheel.

A filtering device comprising a nanotube material may also include a wheel 230 having a support material 232 with a continuous region of filter 120*e* formed or disposed thereon, as shown in FIG. 16. The wheel 230 may be turned or rotated to position the filter 120*e* in the path of EUV light 148 (see FIG. 6), as the filter 120*e* is eroded or after the temperature is raised to a predetermined level, for example.

Figure 17:
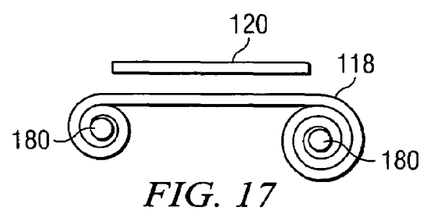
FIG. 17 shows an embodiment wherein a sixth material layer is disposed proximate the filter, wherein the sixth material layer may be disposed on a reel.
Figure 18:
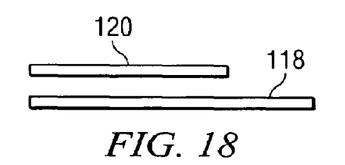
FIG. 18 shows an embodiment wherein a sixth material layer is disposed on a wheel proximate the filter.

The sixth material layer 118 may be disposed proximate the filter 120 in one embodiment, rather than being disposed directly on the filter 120, as shown in a cross-sectional view in FIG. 17. The sixth material layer 118 may comprise a reel, so that the sixth material layer 118 may be reeled out or moved in the path of the EUV light 148 by cylinders 180, for example. Alternatively, as shown in a cross-sectional view in FIG. 18, the sixth material layer 118 may be disposed on a wheel that may be turned or rotated, in another embodiment.

Figure 19:
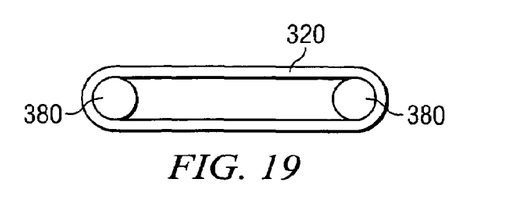
FIG. 19 shows an embodiment wherein the filter comprises a moveable reel.

The novel filter 320 may alternatively comprise a reel, as shown in FIG. 19. The filter 320 preferably comprises the materials described with reference to filter 120 in FIGS. 1 and 2, and may comprise a first material layer 102, a second material layer 108, a fourth material layer 114, a patterned third material layer 112, and optionally may include a patterned fifth material 116 and sixth material layer 118. In this embodiment, the second material layer 108 and the fourth material layer 114 preferably comprise a relatively thin coating, so that the filter 320 is flexible enough to be moved on cylinders 380, for example. The second material layer 108 and the fourth material layer 114 may comprise silicon or nitride coatings, in this embodiment, for example. The filter 320 may comprise a belt that may be rolled or reeled in a circular path about cylinders 380, as shown, or may be rolled up onto the cylinders 380, for example (not shown).

Figure 20:
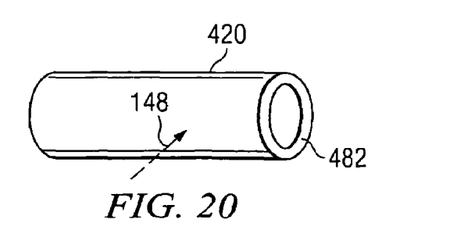
FIG. 20 shows another embodiment, wherein the filter is mounted on a rotatable drum.

The filter 420 may be mounted on a movable hollow drum 482, as shown in FIG. 20. The drum preferably comprises a heat-resistant material such as silicon or silicon nitride, as examples, although the drum 482 may alternatively comprise other materials. In this embodiment, the EUV light 148 is passed through one side of the drum 482, and through the opposite side of the drum 482. A coolant may be disposed inside the drum 482, for example. The EUV light 148 is debris filtered on the first pass (e.g., upon entry) through the filter 420, and well as spectral filtered. On the second pass (e.g., upon exit), the EUV light 148 is spectral filtered again.

The novel filter 120 described herein may be used as a blade material in a foil trap, for example, in one embodiment, increasing the transmission of the foil trap, in one embodiment. The filter 120 may be used in a rotatable foil trap, for example, in another embodiment. The filter may be mounted on a cylinder, a drum, a belt, a reel, a wheel, a disc, a foil trap, or a rotatable foil trap, as examples, although the filter may also be mounted on other objects. Alternatively, the filter may have the shape of a cylinder, a drum, a belt, a reel, a wheel, a disc, a foil trap, or a rotatable foil trap, as examples, although the filter may also comprise other shapes.

While embodiments of the present invention have been described herein for use in EUV lithography systems and equipment, the novel filters and filter devices 120, 120', 120", 130, 172, 120c, 120d, 220, 230, and 320 described herein have useful application in applications where clean light is desired. For example, the filters 120, 120', 120", 130, 172, 120c, 120d, 220, 230, and 320 can be adapted to filter out other wavelengths of light than EUV light, for other applications.

EUV lithography is expected to be the lithography technique used to manufacture 50 nm or less devices in the future. The reduced debris in EUV lithography systems provided by the filters 120, 120', 120", 130, 172, 120c, 120d, 220, 230, and 320 described herein reduces the cost of ownership of the EUV lithography systems and also increases the viability of EUV sources, because reduced debris increases the lifetime of the EUV sources to an acceptable level. Thus, the novel filters 120, 120', 120", 130, 172, 120c, 120d, 220, 230, and 320 increase the viability of EUV lithography and is a key enabler of EUV lithography as a lithography technique for high volume production of semiconductor devices, which is an important achievement for the semiconductor industry. Lifetime of EUV lithography equipment may be extended thousand-fold using the novel filters 120, 120', and 120", 130, 172, 120c, 120d, 220, 230, and 320 described herein, for example.

Additional advantages of embodiments of the invention include providing novel filters 120, 120', 120", 130, 172, 120c, 120d, 220, 230, and 320 having high EUV transmission, e.g., 70% or greater, with improved filtering performance and increased optics protection. Substantially no debris passes by the filters 120, 120', 120", 130, 172, 120c, 120d, 220, 230, and 320 to reach optics collection devices of an EUV lithography system. The filters 120, 120', and 120", 130, 172, 120c, 120d, 220, 230, and 320 are also adapted to provide spectral purity filtering, and thus can be used anywhere along the path of EUV light 148 in an EUV lithography system 140. The use of a separate spectral purity filter 138 can be eliminated with the use of the filters 120, 120', 120", 130, 172, 120c, 120d, 220, 230, and 320, reducing the number of components in the EUV lithography system 140. The filters 120, 120', 120", 130, 172, 120c, 120d, 220, 230, and 320 may be used in conjunction with foil trap devices and other debris mitigation devices, for example. Patterning and deposition techniques used in semiconductor device manufacturing can be used to manufacture the filters, without the strict manufacturing requirements, because the filters 120, 120', 120", 130, 172, 120c, 120d, 220, 230, and 320 are a mechanical device that may be consumed in the lithography process.

Furthermore, embodiments of the present invention are easily implementable because the properties of the components are known, and all components are commercially available, for example. The filter 120, 120', 120", 130, 172, 120c, 120d, 220, 230, and 320 described herein may be manufactured inexpensively. Existing manufacturing methods used for making stencil masks may be used, without the stringent placement requirements. The basic structure of the filters 120, 120', 120", 130, 172, 120c, 120d, 220, 230, and 320 may be modified, e.g., by modifying the materials and thicknesses, to produce a filter adapted to function as a spectral purity filter only, rather than as a debris filter. The filters 120, 120', 120", 130, 172, 120c, 120d, 220, 230, and 320 may be coated with an additional highly transmissive layer, e.g., sixth material layer 118, during fabrication, for additional resistance to erosion; or after a period of use, to refurbish the filters 120, 120', 120", 130, 172, 120c, 120d, 220, 230, and 320; or both during fabrication and after a period of use, as examples.

Although embodiments of the present invention and their advantages have been described in detail, it should be understood that various changes, substitutions and alterations can be made herein without departing from the spirit and scope of the invention as defined by the appended claims. For example, it will be readily understood by those skilled in the art that many of the features, functions, processes, and materials described herein may be varied while remaining within the scope of the present invention. Moreover, the scope of the present application is not intended to be limited to the particular embodiments of the process, machine, manufacture, composition of matter, means, methods and steps described in the specification. As one of ordinary skill in the art will readily appreciate from the disclosure of the present invention, processes, machines, manufacture, compositions of matter, means, methods, or steps, presently existing or later to be developed, that perform substantially the same function or achieve substantially the same result as the corresponding embodiments described herein may be utilized according to the present invention. Accordingly, the appended claims are intended to include within their scope such processes, machines, manufacture, compositions of matter, means, methods, or steps.

What is claimed is:

1. A filter, comprising:
    a first material layer, the first material layer comprising a nanotube material and having a first side and a second side, the first material layer being transparent to a first wavelength of light;
    a second material layer disposed over the first side of the first material layer, the second material layer being transparent to the first wavelength of light;
    a third material layer disposed over the second material layer, the third material layer comprising a supportive material and being patterned to expose a portion of the second material layer; and
    a fourth material layer disposed over the second side of the first material layer, the fourth material layer being transparent to the first wavelength of light.

2. The filter according to claim 1, wherein the first wavelength of light comprises extreme ultraviolet (EUV) light.

3. The filter according to claim 1, wherein filter is adapted to filter debris or provide spectral purity filtering of wavelengths of light other than the first wavelength of light.

4. The filter according to claim 1, further comprising a fifth material layer disposed over the fourth material layer, the fifth material layer comprising a supportive material and being patterned to expose a portion of the fourth material layer.

5. The filter according to claim 4, wherein the fifth material layer comprises about 5 mm or less of silicon nitride, boron nitride, silicon carbide, silicon, or silicon with an insulating layer disposed thereon, or combinations or multiple layers thereof.

6. The filter according to claim 1, wherein the first material layer comprises about 10 to 500 nm of a carbon, silicon nitride, or boron nitride containing material.

7. The filter according to claim 1, wherein the second material layer and the fourth material layer each comprise about 100 nm or less of zirconium, silicon nitride, boron nitride, silicon carbide, or other material transparent to EUV light.

8. The filter according to claim 7, wherein the fourth material layer is the same as, or different than, the second material layer.

9. The filter according to claim 1, wherein the third material layer comprises about 5 mm or less of silicon nitride, boron nitride, silicon carbide, silicon, or silicon with an insulating layer disposed thereon, or combinations or multiple layers thereof.

10. The filter according to claim 1, further comprising a sixth material layer disposed over the fourth material layer, the second material layer and the third material layer, or both, the sixth material layer being transparent to the first wavelength of light.

11. The filter according to claim 10, wherein the sixth material layer is disposed proximate the filter, wherein the sixth material layer comprises a reel or wheel that is movable with respect to the filter.

12. The filter according to claim 10, wherein the sixth material layer comprises about 100 nm or less of zirconium, silicon nitride, boron nitride, or silicon carbide, or other material transparent to EUV light.

13. The filter according to claim 1, wherein the patterned third material layer comprises a plurality of support struts, wherein the first material layer comprises a plurality of nanotube fibers that extend between the support struts, the nanotube fibers comprising a first length, wherein the distance between two adjacent struts of the patterned third material layer comprises a second length, and wherein the first length is greater than or equal to the second length.

14. The filter according to claim 1, wherein the second material layer comprises a plurality of first apertures, wherein the fourth material layer comprises a plurality of second apertures, wherein the second apertures are not aligned with the first apertures.

15. A filter according to claim 1, mounted on or having a shape of a cylinder, a drum, a belt, a reel, a wheel, a disc, a foil trap, or a rotatable foil trap.

16. A filter device, comprising:
a support for at least one filter according to claim 1, and;
at least one filter according to claim 1 coupled to the support.

17. The filter device according to claim 16, wherein the filter device is attachable to an extreme ultraviolet light (EUV) lithography system, wherein the filter device is rotatable within the EUV lithography system.

18. An extreme ultraviolet (EUV) source, comprising:
a source for generating EUV light, the EUV light source having an output; and
a filter according to claim 1 disposed proximate the output of the EUV light source, the first side of the filter facing the EUV light source, wherein the filter is adapted to prevent or mitigate debris produced by the EUV light source from passing by the filter.

19. An extreme ultraviolet light (EUV) lithography system, comprising:
an EUV light source adapted to generate EUV light, the EUV light adapted to travel along a path through the EUV lithography system;
an optical collection system proximate the EUV light source; and
a filter according to claim 1 disposed in the path of the EUV light.

20. The EUV lithography system according to claim 19, wherein the filter is disposed between the EUV light source and the optical collection system, and wherein the filter is adapted to protect the optical collection system from debris generated by the EUV light source.

21. The EUV lithography system according to claim 19, wherein the filter is positioned at an angle of about 0 to 30 degrees from normal away from the EUV light source.

22. The EUV lithography system according to claim 19, further comprising a gas curtain, other mitigation device, or electromagnetic (E&M) mitigation device disposed between the EUV light source and the filter.

23. The EUV lithography system according to claim 22, wherein the gas curtain comprises He or other gas mixture that allows EUV transmission.

24. The EUV lithography system according to claim 22, wherein the filter and EUV light source are contained in a sealed area, wherein the first side of the filter faces the EUV light source, further comprising an inert gas disposed proximate the second side of the filter.

25. The EUV lithography system according to claim 24, wherein the inert gas comprises Ar.

26. The EUV lithography system according to claim 19, further comprising an exposure area proximate the optical collection system along the path of the EUV light, wherein the filter is disposed proximate an input of the optical collection system, or proximate an input of the exposure area, and wherein the filter is adapted to provide spectral purity filtering.

27. The EUV lithography system according to claim 19, further comprising means for cooling the filter.

28. The EUV lithography system according to claim 19, wherein the second material layer of the filter comprises a plurality of first apertures, wherein the fourth material layer of the filter comprises a plurality of second apertures, wherein the second apertures are not aligned with the first apertures, and wherein the first apertures and the second apertures accommodate for vacuum fluctuations in the EUV lithography system.

29. A method of manufacturing a filter, the method comprising:
providing a first material layer, the first material layer comprising a nanotube material and having a first side and a second side, the first material layer being transparent to a first wavelength of light;
disposing a second material layer over the first side of the first material layer, the second material layer being transparent to the first wavelength of light;
disposing a third material layer over the second material layer, the third material layer comprising a supportive material;

disposing a fourth material layer over the second side of the first material layer, the fourth material layer being transparent to the first wavelength of light; and patterning the third material layer to expose a portion of the second material layer.

30. The method according to claim 29, further comprising disposing a sixth material layer over the patterned third material layer and the second material layer, the sixth material layer being transparent to the first wavelength of light.

31. The method according to claim 30, wherein before disposing the sixth material layer, the filter is used as a filter in a system, wherein disposing the sixth material layer comprises refurbishing the filter.

32. The method according to claim 29, further comprising disposing a fifth material layer over the fourth material layer, the fifth material layer comprising a supportive material, and patterning the fifth material layer to expose a portion of the fourth material layer.

33. The method according to claim 32, further comprising disposing a sixth material layer over the patterned third material layer and the second material layer, over the patterned fifth material layer and the fourth material layer, or both, the sixth material layer being transparent to the first wavelength of light.

34. The method according to claim 29, wherein disposing the third material layer comprises providing a semiconductor wafer, wherein the method comprises:

first, providing the semiconductor wafer;

second, disposing the second material layer over the semiconductor wafer;

third, disposing the first material layer over the second material layer;

fourth, disposing the fourth material layer over the first material layer; and fifth, patterning the semiconductor wafer.

35. The method according to claim 34, further comprising, after disposing the fourth material layer over the first material layer, disposing a fifth material layer over the fourth material, and patterning the fifth material layer to expose a portion of the fourth material layer.

36. The method according to claim 29, further comprising, before providing the first material layer, providing a semiconductor wafer, wherein the method comprises:

first, disposing the third material layer over the semiconductor wafer;

second, disposing the second material layer over the third material layer;

third, disposing the first material layer over the second material layer;

fourth, disposing the fourth material layer over the first material layer;

fifth, removing the semiconductor wafer; and sixth, patterning the third material layer.

37. The method according to claim 36, further comprising, after disposing the fourth material layer over the first material layer, disposing a fifth material layer over the fourth material, and patterning the fifth material layer to expose a portion of the fourth material layer.

38. A method of filtering debris in an extreme ultraviolet light (EUV) lithography system having at least one optical component, the method comprising:

disposing a filter proximate the at least one optical component, the filter comprising a layer of nanotube material with support material disposed on at least one side of the nanotube material; and generating EUV radiation, wherein generating the EUV radiation produces debris, wherein the filter is adapted to reduce accumulation of the debris on the at least one optical component and reduce damage to the at least one optical component.

* * * * *